US012408333B2

(12) United States Patent
Saito et al.

(10) Patent No.: US 12,408,333 B2
(45) Date of Patent: Sep. 2, 2025

(54) STORAGE APPARATUS, LIQUID DISCHARGE HEAD, AND LIQUID DISCHARGE APPARATUS

(71) Applicant: CANON KABUSHIKI KAISHA, Tokyo (JP)

(72) Inventors: Takaaki Saito, Kanagawa (JP); Yoji Shimoyama, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 274 days.

(21) Appl. No.: 18/188,546

(22) Filed: Mar. 23, 2023

(65) Prior Publication Data

US 2023/0311487 A1    Oct. 5, 2023

(30) Foreign Application Priority Data

Mar. 30, 2022   (JP) ................. 2022-057092

(51) Int. Cl.
*H10B 20/20* (2023.01)
*H10B 20/25* (2023.01)
*B41J 2/045* (2006.01)

(52) U.S. Cl.
CPC ............. *H10B 20/25* (2023.02); *H10B 20/20* (2023.02); *B41J 2/04541* (2013.01); *B41J 2/04586* (2013.01)

(58) Field of Classification Search
CPC ...... H10B 20/25; H10B 20/20; B41J 2/04541; B41J 2/04586; B41J 2/0455; B41J 2/0458; B41J 2/04581; B41J 2/04543
USPC ................................. 365/96, 225.7
See application file for complete search history.

(56) References Cited

U.S. PATENT DOCUMENTS

| | | | |
|---|---|---|---|
| 6,775,171 B2* | 8/2004 | Novosel ................. | G11C 17/16 365/96 |
| 10,226,921 B2 | 3/2019 | Ohmura | |
| 2002/0041533 A1* | 4/2002 | Toda ...................... | G11C 17/16 365/225.7 |
| 2003/0214362 A1* | 11/2003 | Gauthier ................. | H03L 7/18 331/185 |
| 2004/0100849 A1* | 5/2004 | Novosel ................. | G11C 17/16 365/225.7 |
| 2004/0205314 A1* | 10/2004 | Babudri ............... | G06F 12/1425 711/E12.099 |
| 2006/0158923 A1* | 7/2006 | Namekawa ............ | G11C 17/18 365/96 |

(Continued)

FOREIGN PATENT DOCUMENTS

JP          2014058130 A       4/2014

OTHER PUBLICATIONS

Co-pending U.S. Appl. No. 18/176,584, filed Mar. 1, 2023.
Co-pending U.S. Appl. No. 18/169,290, filed Feb. 15, 2023.

*Primary Examiner* — Michael T Tran
(74) *Attorney, Agent, or Firm* — Venable LLP

(57) ABSTRACT

A storage apparatus, comprising a memory unit including an anti-fuse element, an information write unit configured to write information in the anti-fuse element by periodically applying a signal to the memory unit, and a control unit configured to execute drive control of the information write unit, wherein based on a determination result as to whether the signal periodically output by the information write unit satisfies a criterion, the control unit changes a period of a signal to be output by the information write unit.

8 Claims, 7 Drawing Sheets

(56) References Cited

U.S. PATENT DOCUMENTS

| | | | |
|---|---|---|---|
| 2010/0265754 A1* | 10/2010 | Saito | G11C 17/18 365/96 |
| 2010/0289524 A1* | 11/2010 | Or-Bach | H01L 23/5252 326/38 |
| 2014/0078842 A1* | 3/2014 | Oh | G11C 29/808 365/200 |
| 2015/0049546 A1* | 2/2015 | Choi | G11C 17/16 365/185.09 |
| 2015/0255169 A1* | 9/2015 | Sakamoto | G11C 29/789 327/525 |
| 2017/0136765 A1 | 5/2017 | Ohmura | |
| 2017/0153831 A1* | 6/2017 | Kim | G11C 29/52 |
| 2017/0177872 A1* | 6/2017 | McLean | H04L 9/0861 |
| 2021/0202023 A1* | 7/2021 | Lam | G11C 29/26 |
| 2022/0293200 A1* | 9/2022 | Fukuda | G11C 17/18 |

\* cited by examiner

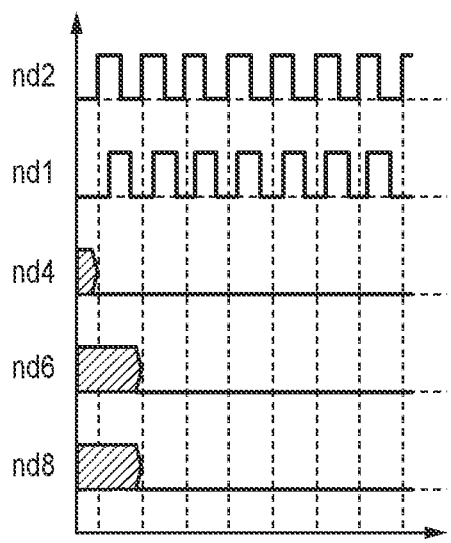
FIG. 5A1
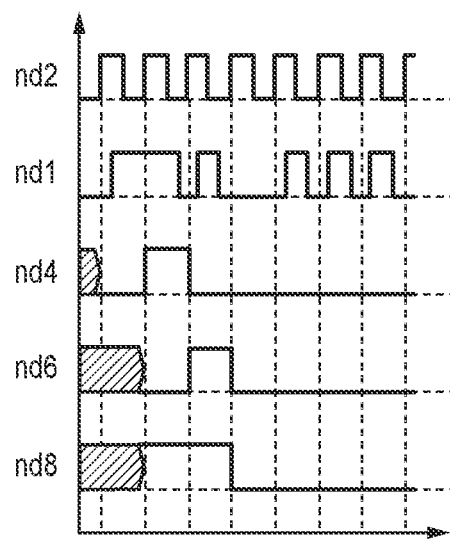
FIG. 5A2
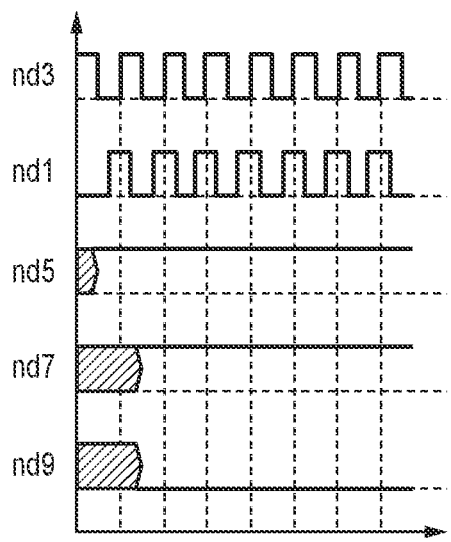
FIG. 5B1
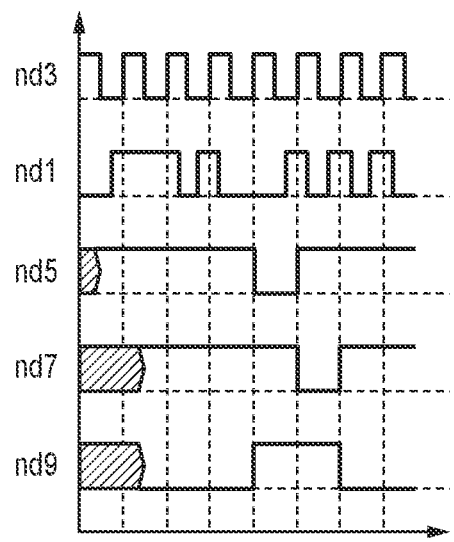
FIG. 5B2

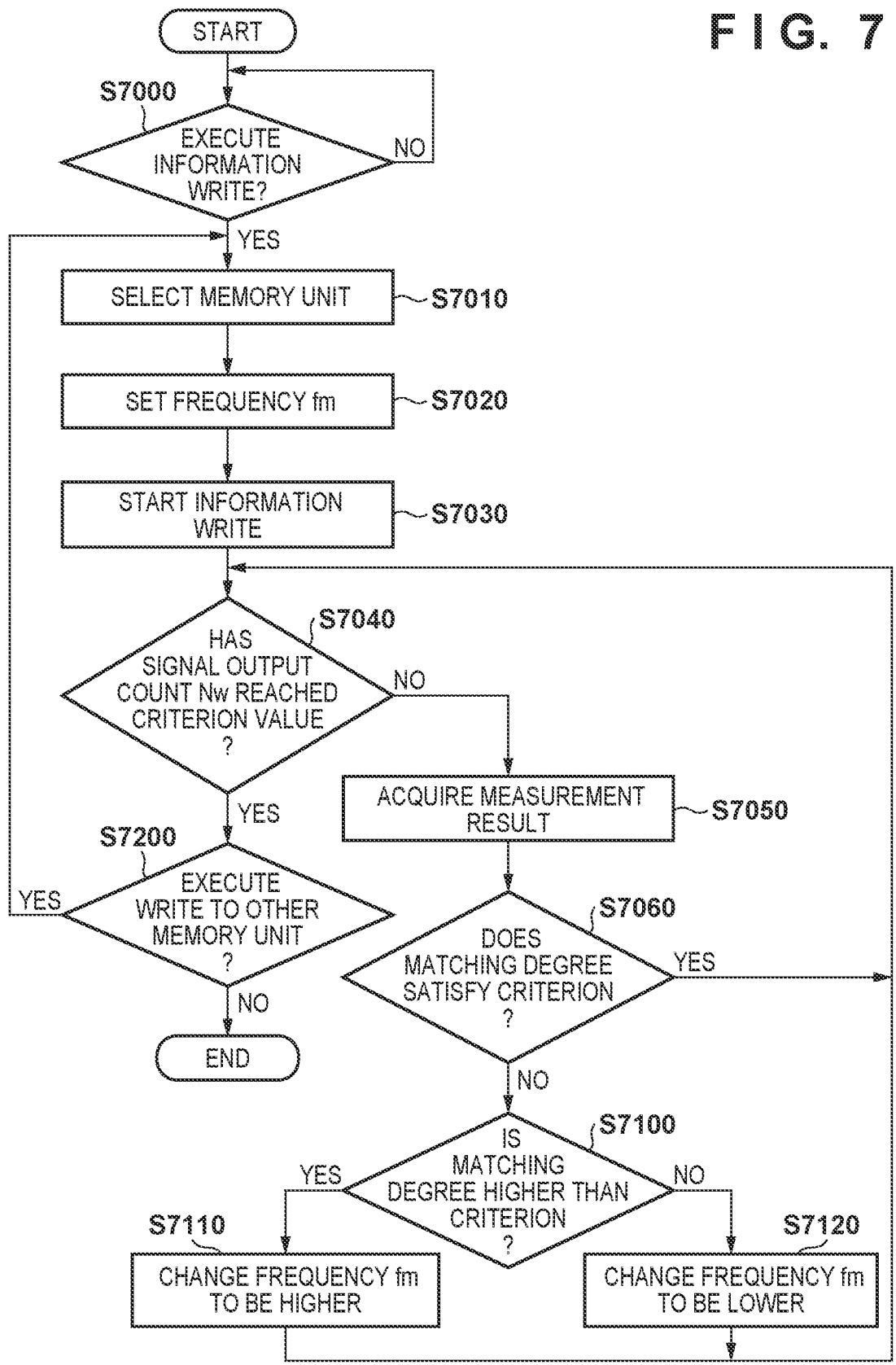

STORAGE APPARATUS, LIQUID DISCHARGE HEAD, AND LIQUID DISCHARGE APPARATUS

BACKGROUND OF THE INVENTION

Field of the Invention

The present invention mainly relates to a storage apparatus.

Description of the Related Art

Some electric appliances include a storage apparatus for storing the specific information thereof (Japanese Patent Laid-Open No. 2014-58130). For the storage apparatus, a memory element capable of information write for one time, which is a so-called One Time Programmable (OTP) memory, can be used.

As an example of the OTP memory, an anti-fuse element having a MOS structure is used. In this case, information write can be implemented by causing dielectric breakdown of the MOS structure. In general, a technique that implements more appropriate information write can be demanded.

SUMMARY OF THE INVENTION

It is an exemplary object of the present invention to implement more appropriate information write in a storage apparatus.

One of the aspects of the present invention provides a storage apparatus, comprising a memory unit including an anti-fuse element, an information write unit configured to write information in the anti-fuse element by periodically applying a signal to the memory unit, and a control unit configured to execute drive control of the information write unit, wherein based on a determination result as to whether the signal periodically output by the information write unit satisfies a criterion, the control unit changes a period of a signal to be output by the information write unit.

Further features of the present invention will become apparent from the following description of exemplary embodiments (with reference to the attached drawings).

BRIEF DESCRIPTION OF THE DRAWINGS

FIGS. 5A1, 5A2, 5B1 and 5B2 are timing charts illustrating the signal levels at some nodes in the control unit;

FIG. 7 is a flowchart showing an example of a method of changing the setting of a frequency.

DESCRIPTION OF THE EMBODIMENTS

Figure 1:
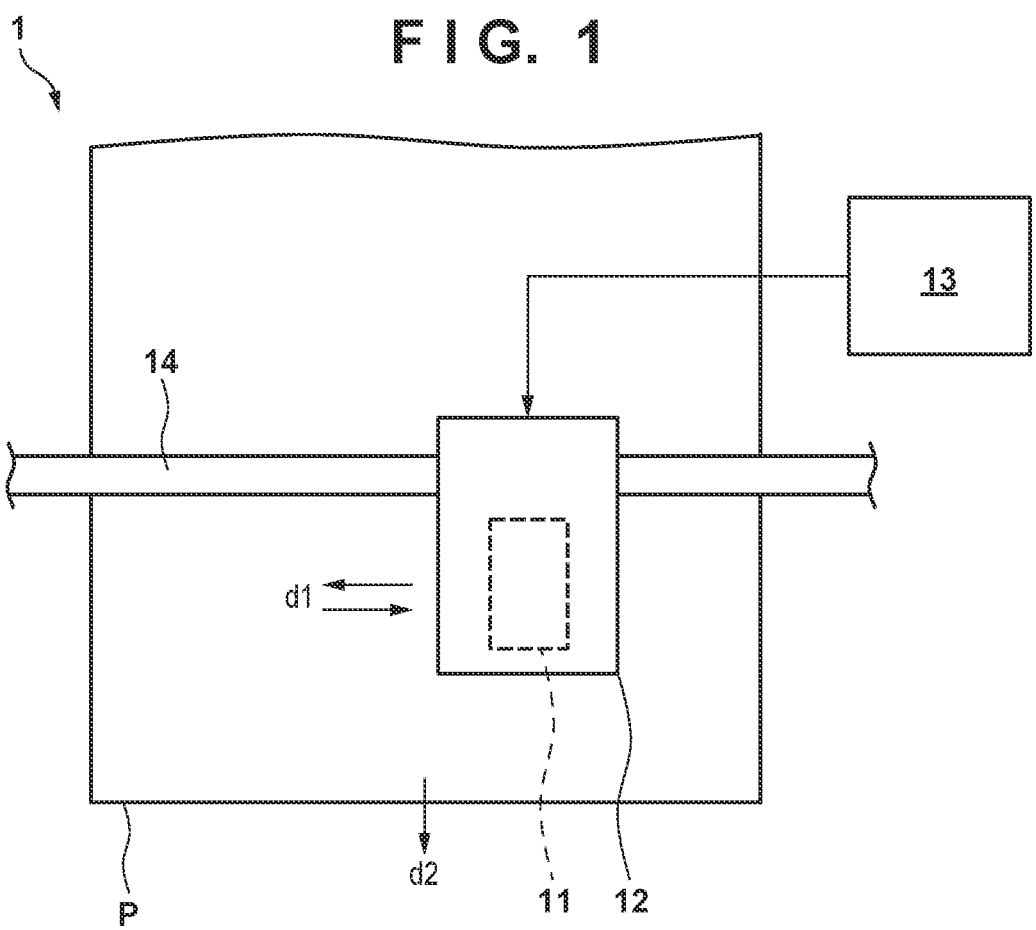
FIG. 1 is a schematic view showing an example of the entire arrangement of a liquid discharge apparatus according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 is a schematic view showing an example of the entire arrangement of a liquid discharge apparatus 1 according to an embodiment. The liquid discharge apparatus 1 includes a liquid discharge head 11, a carriage 12, and a head controller 13 configured to execute drive control of the liquid discharge head 11 and the carriage 12.

The liquid discharge head 11 is provided with a plurality of nozzles (discharge ports) used to discharge a liquid. The liquid discharge head 11 includes a head board on which a plurality of liquid discharge elements corresponding to the plurality of nozzles are provided. Ink can be typically used as the liquid. The liquid discharge head 11 drives each liquid discharge element based on a drive signal or control signal from the head controller 13. With this, the ink is discharged from the corresponding nozzle, and desired printing is executed on, for example, a print medium P such as a sheet-like paper material. Such a printing mode can be called an inkjet method.

The liquid discharge head 11 is installed on the carriage 12. The carriage 12 can be reciprocated in a direction d1 along a guide 14 based on a drive signal or control signal from the head controller 13. The print medium P is conveyed in a direction d2 by a conveyance mechanism of the liquid discharge apparatus 1. During the conveyance, the liquid discharge head 11 can be reciprocated in the direction d1 by the carriage 12.

The head controller 13 executes drive control of the liquid discharge head 11 while reciprocating the carriage 12. With this, desired printing is implemented on the print medium P. For example, a character, a symbol, a graphic, a photograph, or the like is formed on the print medium P.

The head controller 13 may be expressed as a head driver or the like. The liquid discharge head 11 may simply be expressed as a discharge head, or may be expressed as a printhead. In this embodiment, the liquid discharge head 11 can also be expressed as an inkjet head, a serial head, or the like. The liquid discharge apparatus 1 may simply be expressed as a discharge apparatus, or may be expressed as a printing apparatus. In this embodiment, the liquid discharge apparatus 1 can also be expressed as an inkjet printer or the like.

Figure 2:
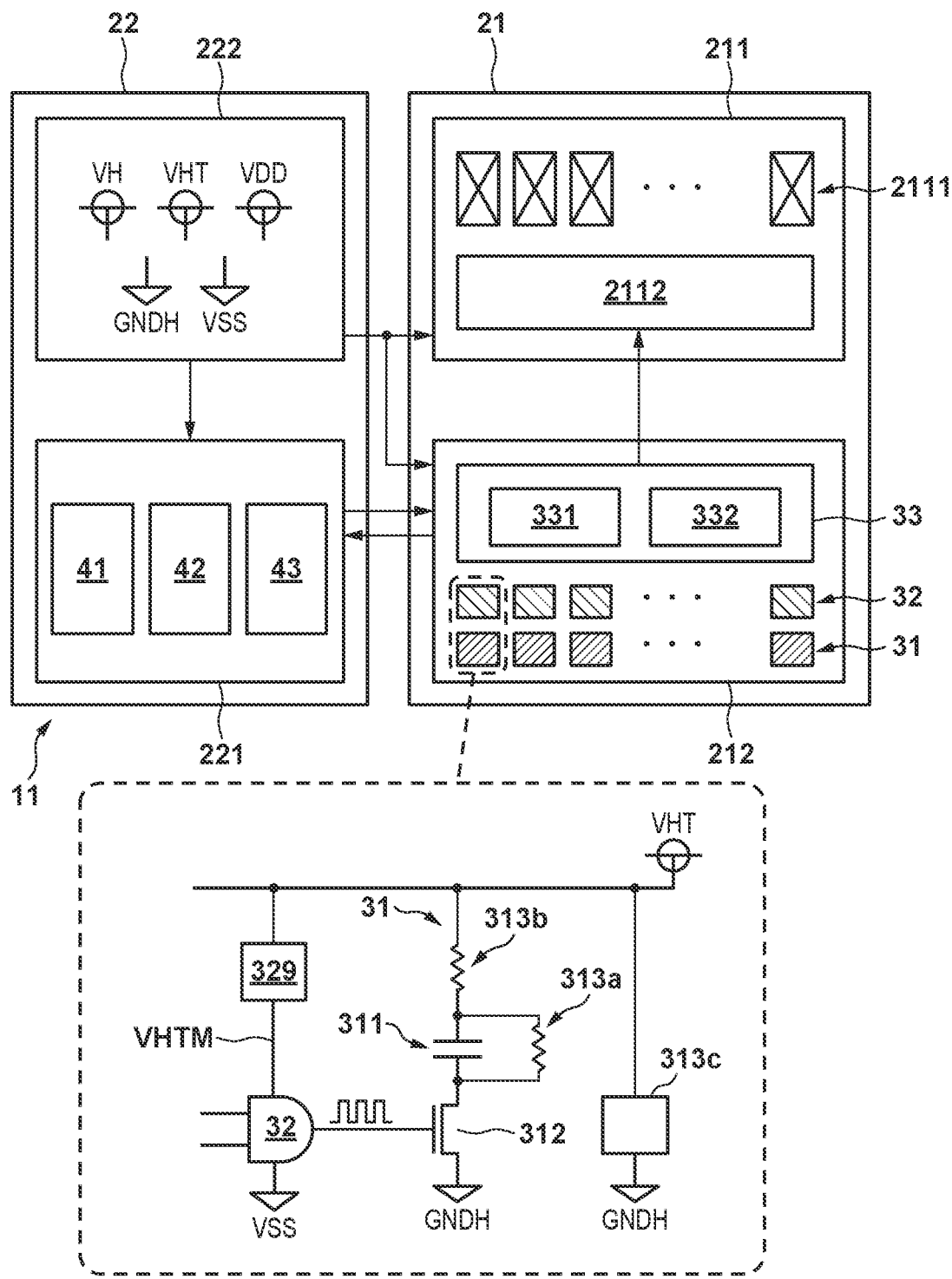
FIG. 2 is a block diagram showing an example of the arrangement of a liquid discharge head.

FIG. 2 is a block diagram showing an example of the arrangement of the liquid discharge head 11. The liquid discharge head 11 includes a head board 21 and a head drive board 22. The head board 21 includes a function unit 211 and a storage apparatus 212. The head drive board 22 includes an arithmetic unit 221 and a power supply unit 222.

In the head board 21, the function unit 211 is configured to be capable of implementing a main function (here, a printing function) as the liquid discharge head 11. In this embodiment, the function unit 211 includes a plurality of liquid discharge elements 2111 and an element drive unit 2112 that can individually drive the plurality of liquid discharge elements 2111. The liquid discharge element 2111 may simply be expressed as a discharge element, or may be expressed as a printing element or the like. A heater element or an electrothermal transducer can be typically used for the liquid discharge element 2111, but another element such as a piezoelectric element may be used. Although a description is omitted here, it is only required that the function unit 211 is configured to be capable of driving by a known method. For example, the plurality of liquid discharge elements 2111 may be divided into several blocks and driven on the block basis (in a so-called time division drive method).

The storage apparatus 212 can store the specific information of the liquid discharge head 11, and the details thereof will be described later. Examples of the specific information are an identifier, a serial number, a specific parameter, and the like.

In the head drive board 22, the arithmetic unit 221 performs arithmetic processing based on a signal from an external apparatus, and drives the head board 21 based on the arithmetic result. For example, the arithmetic unit 221 drives or controls each of the function unit 211 and the storage apparatus 212. An Application-Specific Integrated Circuit (ASIC) is used for the arithmetic unit 221, but a Central Processing Unit (CPU) and a memory may be used additionally or alternatively.

The power supply unit 222 receives a power supply voltage from an external power supply, and generates a plurality of power supply voltages. Thus, the power supply unit 222 can supply the corresponding voltage to each element. In this embodiment, the power supply unit 222 generates and outputs voltages VH, VHT, and VDD as the power supply voltages. In addition, the power supply unit 222 can output voltages GNDH and VSS as ground voltages. For example, the voltage VH is of 24 V, the voltage VHT is of 24 V, the voltage VDD is of 3.3 V, the voltage GNDH is of 0 V, and the voltage VSS is of 0 V.

Note that, among the above-described voltage VH and the like, those having the same potential may be provided individually so that electrical mutual interference between power supply systems due to potential fluctuations can be prevented. However, they may be provided in common.

The head board 21 and the head drive board 22 are connected to each other, and the function unit 211 can execute printing based on the arithmetic result of the arithmetic unit 221 using the voltage supplied from the power supply unit 222. Further, the storage apparatus 212 can store information based on the arithmetic result of the arithmetic unit 221 using the voltage supplied from the power supply unit 222. Details of this processing will be described later.

The storage apparatus 212 includes a plurality of memory units 31, a plurality of information write units 32, and a control unit 33. Each memory unit 31 includes an anti-fuse element 311, a switch element 312, and protection elements 313a and 313b.

The anti-fuse element 311 is a memory element capable of information write for one time, that is, a memory element in which information cannot be rewritten, and functions as a so-called One Time Programmable (OTP) memory. In this embodiment, a Metal Oxide Semiconductor (MOS) structure is used for the anti-fuse element 311. This MOS structure shows an information unwritten state before dielectric breakdown, and shows an information written state after dielectric breakdown.

A known high breakdown voltage transistor such as a Double-Diffused MOS (DMOS) transistor is used for the switch element 312. The switch element 312 is set in a conductive state (ON state) or a nonconductive state (OFF state) based on a signal from the information write unit 32. If the switch element 312 is set in the conductive state, the voltage VHT is supplied to the anti-fuse element 311. If the switch element 312 is set in the nonconductive state, the supply of the voltage VHT is suppressed.

Although details will be described later, the voltage VHT is periodically supplied to the anti-fuse element 311 by periodically driving the switch element 312. With this, dielectric breakdown of the MOS structure as the anti-fuse element 311 occurs, and information is written in the anti-fuse element 311. Note that information write may be expressed as information write in the memory unit 31, or may be expressed as information write in the storage apparatus 212.

The protection element 313a is connected in parallel with the anti-fuse element 311. A resistor element can be used for the protection element 313a. The protection element 313b is connected in series with the anti-fuse element 311. A resistor element can be used for the protection element 313b. According to the arrangement as described above, if an unexpected overvoltage such as Electro-Static Discharge (ESD) is applied to the power supply line of the power supply voltage VHT, the overvoltage can be guided to another protection element 313c connected to the power supply line. Thus, it is possible to prevent unexpected information write in the anti-fuse element 311 caused by the overvoltage.

Each information write unit 32 is a logic circuit provided so as to correspond to each memory unit 31. In this embodiment, the information write unit 32 is an AND circuit. A voltage VHTM generated from the voltage VHT via a step-down circuit 329 can be supplied to the information write unit 32.

Here, the information write unit 32 periodically applies a signal to the memory unit 31 based on a signal from the control unit 33, thereby writing information in the anti-fuse element 311. By periodically applying the signal to the memory unit 31, a large current from a parasitic capacitance is periodically supplied to the anti-fuse element 311. With this, information write in the anti-fuse element 311 can be implemented relatively rapidly. More specifically, the state of the MOS structure after dielectric breakdown includes a state in which dielectric breakdown has occurred sufficiently (a so-called hard breakdown state) and a state in which dielectric breakdown has occurred partially (a so-called soft breakdown state). By periodically applying the signal to the memory unit 31, the electric energy required to change the MOS structure from the state before dielectric breakdown to the hard breakdown state via the soft breakdown state can be appropriately supplied to the MOS structure.

The information write unit 32 may be expressed as an information write control unit or simply a write control unit or the like, or may be expressed as an information write execution unit or simply a write execution unit or the like.

The control unit 33 is configured to be capable of executing drive control of the information write unit 32. The control unit 33 includes a selection unit 331 and a determination unit 332. Based on a signal from the arithmetic unit 221, the selection unit 331 selects, from the plurality of memory units 31, one memory unit 31 (the information write target memory unit 31) in which information is to be written. The determination unit 332 is configured to be capable of determining whether the signal periodically output by the information write unit 32 satisfies a criterion. For example, a comparison circuit configured to compare the signal to be input to the information write unit 32 and the signal output by the information write unit 32 can be used as the determination unit 332.

Although details will be described later, with the arrangement described above, the control unit 33 changes, based on the determination result as to whether the signal periodically output by the information write unit 32 satisfies the criterion, the period of the signal to be output by the information write unit 32.

The arithmetic unit 221 includes a measurement unit 41, a processing unit 42, and a signal period setting unit 43. The measurement unit 41 measures the determination result of the determination unit 332. Here, the measurement unit 41 measures the number of times the signal output by the information write unit 32 did not satisfy the criterion. Based on the measurement result of the measurement unit 41, the processing unit 42 outputs a predetermined signal to the signal period setting unit 43. Details of this processing will be described later. Based on the signal from the processing unit 42, that is, the measurement result of the measurement unit 41, the signal period setting unit 43 can set the period of the signal to be output by the information write unit 32.

Figure 3:
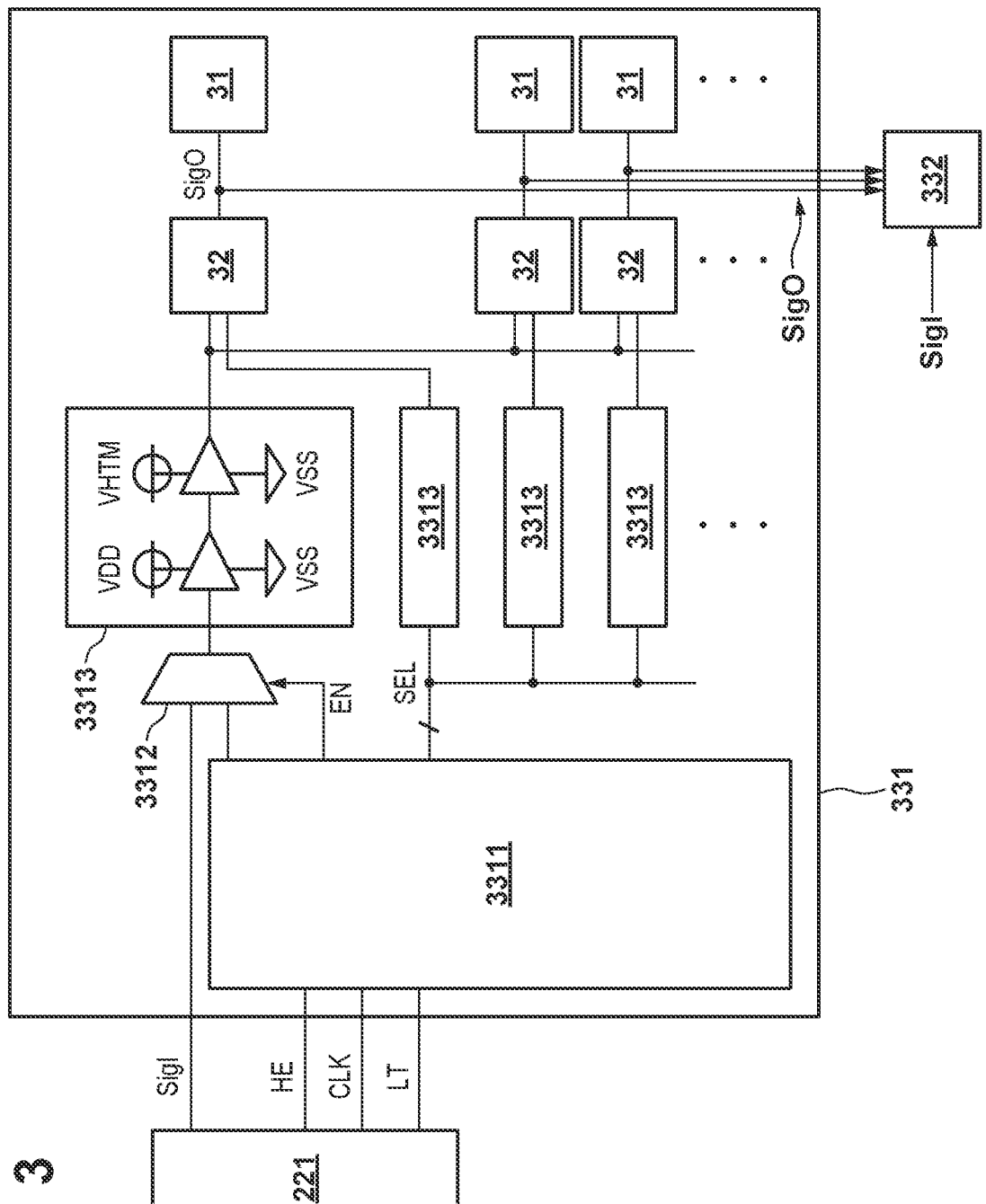
FIG. 3 is a block diagram showing an example of the circuit arrangement of a part of a control unit.

FIG. 3 mainly shows an example of the circuit arrangement of the selection unit 331. The selection unit 331 receives one or more control signals (an enable signal HE, a clock signal CLK, and a latch signal LT) from the arithmetic unit 221 in addition to a signal Sigl. Here, the signal Sigl corresponds to the signal to be input to the information write unit 32. The selection unit 331 includes a logic circuit unit 3311 and a selector 3312. The logic circuit unit 3311 includes, for example, a shift register, a latch circuit, and the like, and outputs an enable signal EN and a selection signal SEL based on the signals HE, CLK, and LT. The selector 3312 outputs, based on the enable signal EN, the signal Sigl to the plurality of information write units 32 via a buffer circuit 3313. One of the plurality of information write units 32 is driven based on the selection signal SEL, and thus supplies a signal SigO to the corresponding memory unit 31.

With the arrangement described above, the selection unit 331 can select the information write target memory unit 31 from the plurality of memory units 31.

Figure 4:
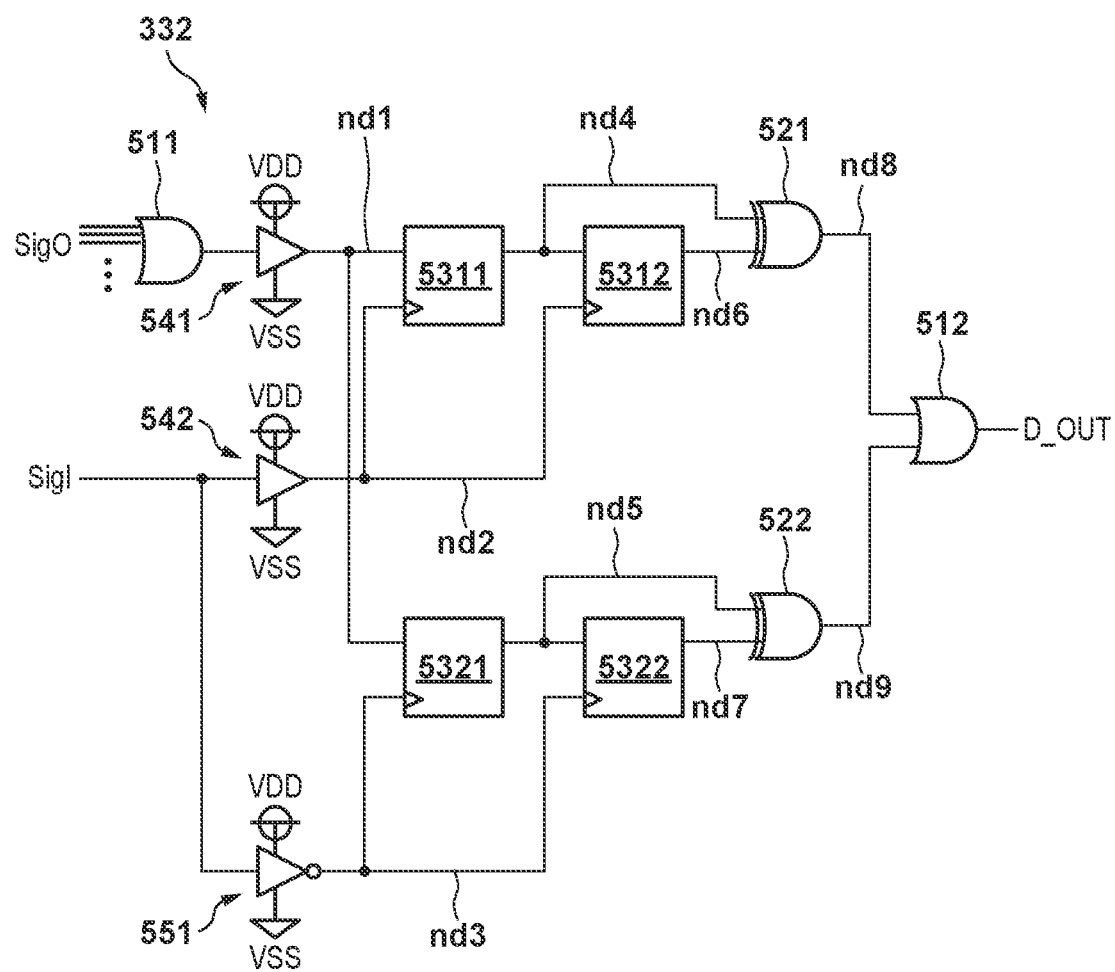
FIG. 4 is a view showing an example of the circuit arrangement of another part of the control unit.

FIG. 4 mainly shows an example of the circuit arrangement of the determination unit 332. The determination unit 332 includes OR circuits 511 and 512, exclusive OR circuits (XOR circuits) 521 and 522, and flip flop circuits 5311, 5312, 5321, and 5322.

The OR circuit 511 receives the output signals SigO of the plurality of information write units 32, and outputs a signal corresponding to the result of these signals to the flip flop circuits 5311 and 5321 via a buffer circuit 541. The signal Sigl is input to the flip flop circuits 5311 and 5312 via a buffer circuit 542, and also input to the flip flop circuits 5321 and 5322 via an inverter circuit 551. The output terminal of the flip flop circuit 5311 is connected to the input terminal of the flip flop circuit 5312. The output terminal of the flip flop circuit 5321 is connected to the input terminal of the flip flop circuit 5322. The XOR circuit 521 outputs a signal corresponding to the output signals of the flip flop circuits 5311 and 5312 to the OR circuit 512. The XOR circuit 522 outputs a signal corresponding to the output signals of the flip flop circuits 5321 and 5322 to the OR circuit 512. The OR circuit 512 receives the signals from the XOR circuits 521 and 522, and outputs a signal D_OUT corresponding to the received signals to the measurement unit 41.

With the arrangement described above, the determination unit 332 determines whether the signal Sigl as the signal to be input to the information write unit 32 matches the signal SigO as the signal output by the information write unit 32, and outputs the determination result as the signal D_OUT to the measurement unit 41. In this respect, it can be said that this determination result (signal D_OUT) corresponds to the comparison result between the signal Sigl to be input to the information write unit 32 and the signal SigO output by the information write unit 32.

Based on the signal D_OUT, if the signal Sigl and the signal SigO do not match each other, the measurement unit 41 counts up the measurement value.

FIGS. 5A1, 5A2, 5B1 and 5B2 show examples of timing charts illustrating the signal levels (potentials) at nodes nd1 to nd9 in the determination unit 332. FIGS. 5A1 and 5B1 show an example in which the signal SigO follows the signal Sigl. FIGS. 5A2 and 5B2 show an example in which the signal SigO does not follow the signal Sigl. In this embodiment, in the case in which the signal SigO follows the signal Sigl (the case shown in FIGS. 5A1 and 5B1, each of the XOR circuits 521 and 522 outputs an L-level (low-level) signal. On the other hand, in the case in which the signal SigO does not follow the signal Sigl (the case shown in FIGS. 5A2 and 5B2), the XOR circuit 521 and/or the XOR circuit 522 outputs an H-level (high-level) signal. Thus, the signal D_OUT is output at H level.

Based on the signal D_OUT described above, in the case in which the signal SigO does not follow the Sigl (the case shown in FIGS. 5A2 and 5B2), the measurement unit 41 considers that the signal Sigl and the signal SigO do not match each other, and counts up the measurement value.

Figure 6:
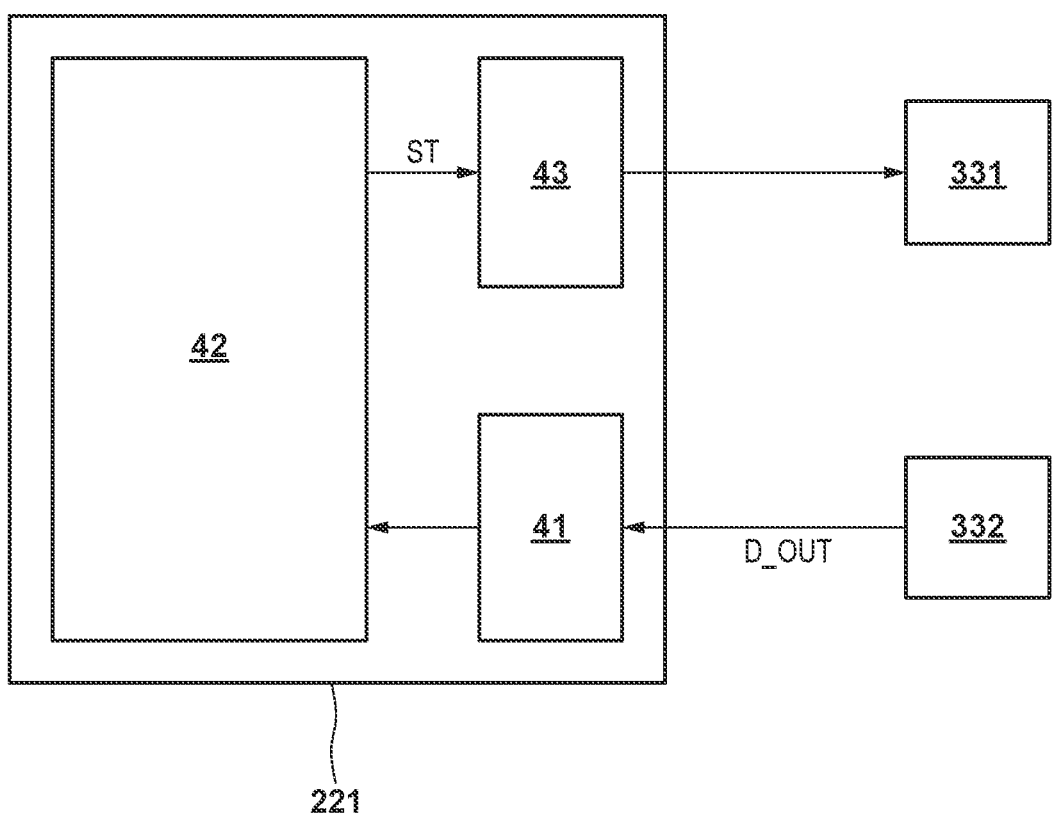
FIG. 6 is a block diagram showing an example of the arrangement of an arithmetic unit.

FIG. 6 mainly shows an example of the arrangement of the arithmetic unit 221. In the arithmetic unit 221, based on the measurement result of the measurement unit 41, the processing unit 42 outputs, to the signal period setting unit 43, a setting signal ST for setting the period of the signal to be output by the information write unit 32. For example, if the matching degree between the signal Sigl and the signal SigO satisfies the criterion, the processing unit 42 maintains/ does not change the setting signal ST to be output to the signal period setting unit 43. If the matching degree between the signal Sigl and the signal SigO does not satisfy the criterion, the processing unit 42 changes the setting signal ST to be output to the signal period setting unit 43. With this, the signal period setting unit 43 can set the period of the signal to be output by the information write unit 32, thereby updating or maintaining the period.

In the following description, letting M be an integer of 2 or more, and m be an arbitrary integer of 1 to M, a frequency fm of the signal to be output by the information write unit 32 can be selectively set from frequencies f1 to fM. For example, if M=6, the frequency fm can be set to one of the frequencies f1 to f6. The frequencies f1 to f6 may be set in advance to, for example, f1=3 MHz, f2=4 MHz, f3=5 MHz, f4=6 MHz, f5=7 MHz, and f6=8 MHz. The initial value of the frequency fm may be fixedly decided to, for example, the frequency fm=f3, or may be decided to arbitrary one by the manufacturer of the liquid discharge head 11 or the user of the liquid discharge apparatus 1.

Note that, although a detailed description is omitted here, when executing printing, the processing unit 42 outputs print data received from an external apparatus to the function unit 211 via the control unit 33.

FIG. 7 is a flowchart showing an example of a method of changing the setting of the frequency fm. This flowchart is executed by the arithmetic unit 221 (mainly, the processing unit 42). The outline of the flowchart is that the initial value of the frequency fm is set, and then the frequency fm is updated or maintained based on the measurement result of the measurement unit 41.

In step S7000 (this is to be simply referred to as "S7000" hereinafter; the same applies to other steps described later), it is determined whether to execute information write in the storage apparatus 212. This determination can be made based on whether a command instructing information write in the storage apparatus 212 is received from an external apparatus. If information write is executed, the process advances to S7010; otherwise, the process returns to S7000 (or this flowchart is terminated).

In S7010, the write target memory unit 31 is selected from the plurality of memory units 31. The memory unit 31 to be selected can be decided based on the above-described command received from the external apparatus and instructing information write in the storage apparatus 212.

In S7020, the initial value of the frequency fm is set. Here, the frequency fm=f3 is set.

In S7030, information write in the above-described selected memory unit 31 is started. This step is performed by the information write unit 32 outputting a signal having the frequency fm to the memory unit 31. Here, the number of times the information write unit 32 outputs the signal to the memory unit 31 is continuously measured by the arithmetic unit 221 as a signal output count Nw.

In S7040, it is determined whether the signal output count Nw has reached a criterion value. As the criterion value, the count enough for the MOS structure of the anti-fuse element 311 to become the hard breakdown state is set. For example, a value of several thousands or several tens of thousands can be set. If the signal output count Nw has reached the criterion value, the process advances to S7200; otherwise, the process advances to S7050.

In S7050, the measurement result of the measurement unit 41 is acquired. In this embodiment, the measurement unit 41 counts up the measurement value if the signal Sigl and the signal SigO do not match each other, and this measurement result is acquired as a signal mismatch count Km.

In S7060, the matching degree between the signal Sigl and the signal SigO is evaluated, and it is determined whether the matching degree satisfies the criterion. If the evaluated matching degree satisfies the criterion, the process returns to S7040; otherwise, the process advances to S7100.

The matching degree between the signal Sigl and the signal SigO can be calculated as, for example, a matching degree Dval=(Nw−Km)/Nw. The matching degree Dval may be expressed as the evaluation value Dval. For example, if DvalL≤Dval≤DvalH with a lower limit value DvalL and an upper limit value DvalH, the process returns to S7040. If Dval<DvalL or DvalH<Dval, the process advances to S7100.

In S7100, it is determined whether the matching degree is higher than the criterion. If the matching degree is higher than the criterion (that is, if DvalH<Dval), the process advances to S7110; otherwise (that is, if Dval<DvalL), the process advances to S7120.

In S7110, the frequency fm is changed to a higher frequency. For example, if the frequency fm=f3, it is changed to the frequency fm=f4. Thereafter, information write is restarted, and the process returns to S7040.

In S7120, the frequency fm is changed to a lower frequency. For example, if the frequency fm=f3, it is changed to the frequency fm=f2. Thereafter, information write is restarted, and the process returns to S7040.

In S7200, it is determined whether it is necessary to execute information write in another memory unit 31. If it is necessary to execute information write in another memory unit 31, the process returns to S7010, and information write in the other memory unit 31 is started with a similar procedure. If it is not required to execute information write in another memory unit 31, it is determined that information write in the storage apparatus 212 is complete, and this flowchart is terminated.

In this manner, if the matching degree between the signal Sigl and the signal SigO falls within the criterion range, the signal period setting unit 43 does not change the period of the signal to be output by the information write unit 32. On the other hand, if the matching degree is higher than the criterion, the signal period setting unit 43 changes the period of the signal to be output by the information write unit 32 so as to have a higher frequency. If the matching degree is lower than the criterion, the signal frequency setting unit 43 changes the period of the signal to be output by the information write unit 32 so as to have a lower frequency.

According to this embodiment, the period of the signal to be output by the information write unit 32 can be changed based on the measurement result of the measurement unit 41. With this, it is possible to efficiently supply the electric energy to the MOS structure during information write in the anti-fuse element 311. Thus, it is possible to relatively rapidly change the MOS structure from the state before dielectric breakdown to the hard breakdown state via the soft breakdown state. Therefore, according to this embodiment, more appropriate information write in the storage apparatus 212 can be relatively easily implemented.

Here, in the example described above, the step of acquiring the measurement result of the measurement unit 41 (see, S7050), the step of evaluating the matching degree Dval (see, S7060), and the like are performed for each pulse of the signal having the frequency fm, but as another example, the steps may be performed every multiple pulses. In this case, the parameters such as Dval and Km necessary for implementing the contents similar to the contents of respective steps are initialized for each period corresponding to multiple pulses. Another parameter can be additionally used.

In the above explanation, to facilitate understanding, each element is denoted using a name associated with its function. However, the elements are not limited to those having the contents described in the embodiment as their main function, and may auxiliarily have the functions. Hence, the expression of each element is not strictly limited and can be replaced with a similar expression. To the same effect, the expression "apparatus" may be replaced with "unit", "component to piece", "member", "structure", "assembly", or the like, or may be omitted.

Here, to facilitate understanding, a plurality of elements corresponding to the above-described plurality of functions are individually exemplified, but they may be at least partially integrally formed, or parts of them may be separately formed. For example, individual elements in the head board 21 and the head drive board 22 may be at least partially integrally formed. For example, some of the functions of the control unit 33 may be provided in the arithmetic unit 221, or some of the functions of the arithmetic unit 221 may be provided in the control unit 33.

Program

The present invention may be implemented by supplying a program configured to implement one or more functions of the above-described embodiments to a system or an apparatus via a network or a storage medium and making one or more processors in the computer of the system or the apparatus to execute processing by reading out and executing the program. For example, the present invention may be implemented by a circuit (for example, an ASIC) that implements one or more functions.

Other Embodiments

In the above description, the inkjet printing apparatus has been exemplified as the liquid discharge apparatus 1, but the present invention is not limited to this. That is, the apparatus 1 may be a single-function printer having only a printing function, or a multi-function printer having a plurality of functions such as a printing function, a FAX function, and a scanner function. The apparatus 1 may also be a manufacturing apparatus configured to manufacture, for example, a color filter, an electronic device, an optical device, or a microstructure by a predetermined printing method.

The term "printing" in this specification should be interpreted in a broad sense. Accordingly, the mode of "printing" does not matter whether the object formed on a print medium is significant information such as characters and graphics, and also does not matter whether the object is visualized so that a human can visually perceive it.

Further, "print medium" should be interpreted in a broad sense, similar to "printing" described above. The concept of "print medium" can include, in addition to paper which is generally used, any member that can accept ink, such as cloth, a plastic film, a metal plate, glass, ceramics, a resin, wood, leather, and the like.

Furthermore, "ink" should be interpreted in a broad sense, similar to "printing" described above. Accordingly, the concept of "ink" can include, in addition to a liquid that forms an image, a figure, a pattern, or the like by being applied onto a print medium, additional liquids that can be used for processing a print medium, processing ink (for example, coagulation or insolubilization of colorants in ink applied onto a print medium), or the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-057092, filed on Mar. 30, 2022, which is hereby incorporated by reference herein in its entirety.

What is claimed is:

1. A storage apparatus comprising:
a memory unit including an anti-fuse element;
an information write unit configured to write information in the anti-fuse element by periodically applying a signal to the memory unit; and
a control unit configured to execute drive control of the information write unit,
wherein
based on a determination result as to whether the signal periodically output by the information write unit satisfies a criterion, the control unit changes a period of a signal to be output by the information write unit, and the determination result corresponds to a comparison result between a signal to be input to the information write unit and a signal output by the information write unit.

2. The apparatus according to claim 1, further comprising a plurality of memory units,
wherein
the memory unit is one of the plurality of memory units, and
the control unit includes a selection unit configured to select, from the plurality of memory units, one memory unit including the anti-fuse element in which information is to be written.

3. The apparatus according to claim 1, wherein the control unit is connected to or includes a signal period setting unit configured to set, based on the determination result, the period of the signal to be output by the information write unit.

4. The apparatus according to claim 3, wherein the signal period setting unit
changes the period of the signal output by the information write unit so as to have a higher frequency if a matching degree between a signal to be input to the information write unit and the signal output by the information write unit is higher than a criterion,
changes the period of the signal output by the information write unit so as to have a lower frequency if the matching degree between the signal to be input to the information write unit and the signal output by the information write unit is lower than the criterion, and
does not change the period of the signal output by the information write unit if the matching degree between the signal to be input to the information write unit and the signal output by the information write unit falls within a criterion range.

5. The apparatus according to claim 1, wherein the memory unit further includes a switch element connected in series with the anti-fuse element, and
the switch element is set in a conductive state based on the signal output by the information write unit.

6. The apparatus according to claim 1, wherein the anti-fuse element has a MOS structure.

7. A liquid discharge head comprising:
a storage apparatus defined in claim 1; and
a discharge element configured to discharge a liquid.

8. A liquid discharge apparatus comprising:
a liquid discharge head defined in claim 7; and
a head controller configured to execute drive control of the liquid discharge head.

* * * * *